(12) United States Patent
Vafai et al.

(10) Patent No.: US 6,279,133 B1
(45) Date of Patent: Aug. 21, 2001

(54) METHOD AND APPARATUS FOR SIGNIFICANTLY IMPROVING THE RELIABILITY OF MULTILEVEL MEMORY ARCHITECTURE

(75) Inventors: Manouchehr Vafai, Los Gatos; Michael D. Rostoker, Boulder Creek, both of CA (US)

(73) Assignee: Kawasaki Steel Corporation, Tokyo (JP)

( * ) Notice: Subject to any disclaimer, the term of this patent is extended or adjusted under 35 U.S.C. 154(b) by 0 days.

(21) Appl. No.: 09/166,500

(22) Filed: Oct. 5, 1998

Related U.S. Application Data
(60) Provisional application No. 60/070,137, filed on Dec. 31, 1997, and provisional application No. 60/070,098, filed on Dec. 31, 1997.

(51) Int. Cl.$^7$ .......................... G11C 29/00; H03M 13/00
(52) U.S. Cl. ............................ 714/763; 714/758
(58) Field of Search .................... 714/758, 752, 714/763, 764, 800, 802, 804, 807, 757, 766, 718; 341/50, 62, 104, 105; 365/189.01

(56) References Cited

U.S. PATENT DOCUMENTS

| | | | |
|---|---|---|---|
| 4,661,929 | 4/1987 | Aoki et al. ............................ | 365/189 |
| 4,701,884 | 10/1987 | Aoki et al. ............................ | 365/189 |
| 4,709,350 | 11/1987 | Nakagome et al. ................... | 365/45 |
| 4,726,021 | * 2/1988 | Horiguchi et al. ................... | 714/773 |
| 4,771,404 | 9/1988 | Mano et al. .......................... | 365/189 |
| 5,012,448 | 4/1991 | Matsuoka et al. .................... | 365/208 |
| 5,233,610 | * 8/1993 | Nakayama et al. ................... | 714/704 |
| 5,262,342 | * 11/1993 | Toyama et al. ....................... | 438/587 |
| 5,293,563 | 3/1994 | Ohta ..................................... | 365/190 |
| 5,377,148 | 12/1994 | Rajsuman ............................. | 365/201 |
| 5,422,845 | 6/1995 | Ong ...................................... | 365/185 |
| 5,450,363 | 9/1995 | Christopherson et al. .......... | 365/205 |
| 5,457,650 | 10/1995 | Sugiura et al. ....................... | 365/184 |
| 5,515,317 | 5/1996 | Wells et al. .......................... | 395/427 |
| 5,523,972 | 6/1996 | Rashid et al. ........................ | 365/185.22 |
| 5,532,955 | 7/1996 | Gilligham ............................ | 365/149 |
| 5,533,036 | 7/1996 | Blake et al. ......................... | 371/40.1 |
| 5,539,690 | 7/1996 | Talreja et al. ....................... | 365/185.22 |
| 5,548,549 | 8/1996 | Ong ...................................... | 365/185.05 |
| 5,550,394 | 8/1996 | Sukegawa et al. ................... | 257/209 |
| 5,574,879 | 11/1996 | Wells et al. .......................... | 395/427 |
| 5,602,789 | 2/1997 | Endoh et al. ........................ | 365/201 |
| 5,612,912 | 3/1997 | Gilligham ............................ | 365/168 |
| 5,668,756 | 9/1997 | Tomioka .............................. | 365/185.03 |
| 5,671,388 | 9/1997 | Hasbun ................................ | 395/430 |
| 5,682,394 | 10/1997 | Blake et al. ......................... | 371/40.1 |
| 5,689,465 | 11/1997 | Sukegawa et al. ................... | 365/200 |

FOREIGN PATENT DOCUMENTS

0365114A2 * 7/1989 (EP) .

* cited by examiner

Primary Examiner—Christine T. Tu
(74) Attorney, Agent, or Firm—Gerald E. Linden (57) ABSTRACT

Method and apparatus for significantly improving the reliability of multilevel (MLT) memory architecture. Before writing to MLT architecture, each MLT word is encoded into a coded bit stream in such a way that the resultant coded data contains the original word plus additional digits which are a function of the content of memory. During the reading of the memory, the stored data is decoded, and takes advantage of redundancy to correct and eliminate errors introduced during read and write operations of the MLT architecture. The invention is useful for systems such as general-purpose computers (PCs, workstations, etc.), telecommunications devices (telephones—wired and wireless, switches, hubs, routers, etc.), audio and visual devices (recording and playback, editing, format switching, compression, etc.), vehicles (automobiles, aircraft, trains, boats, satellites, spacecraft, etc.). Systems and subsystems may be incorporated on a single integrated circuit (IC) die having MLT RAM or enhanced MLT memory. An electronic component (e.g., integrated circuit) incorporating the technique is suitably included in a system or subsystem having electrical functionality, such as general purpose computers, telecommunications devices, and the like.

15 Claims, 4 Drawing Sheets

METHOD AND APPARATUS FOR SIGNIFICANTLY IMPROVING THE RELIABILITY OF MULTILEVEL MEMORY ARCHITECTURE

CROSS-REFERENCE(S) TO RELATED APPLICATION(S)

This application is a continuation-in-part of commonly-owned, copending U.S. patent application Ser. No. 60/070,137 filed Dec. 31, 1997, and of commonly-owned, copending U.S. patent application Ser. No. 60/070,098 filed Dec. 31, 1997, both of which are incorporated in their entirety by reference herein.

TECHNICAL FIELD OF THE INVENTION

The present invention relates to digital information (data) storage (and retrieval) and, more particularly, to techniques for writing to and reading from multilevel (MLT) memories.

BACKGROUND OF THE INVENTION

A conventional form of semiconductor memory is random access memory (RAM) in which information (data values) is stored as electrical charges in an array (columns and rows) of storage cells. Dynamic RAM (DRAM) storage cells are extremely small, but have only relatively short-term storage capability and must be "refreshed" periodically. Static RAM (SRAM) storage cells have the capability of retaining data values as long as power is applied without needing to be refreshed. Interface logic controls the writing of data to and the reading of data from the memory array. Data is typically stored as bytes, or some multiple thereof, each byte representing eight bits of binary information. For example, a given single data value may be 8, 16, 32, 64 or more binary bits "wide", requiring corresponding 8, 16, 32, 64 or more storage cells in the memory array.

"Conventional" memories for digital information storage come in a wide variety of technologies including, but not limited to:

Fuse-link ROM: Information is stored in an array of fuses (which are normally shorted and are blown "open") or anti-fuses (which are normally open and are programmed "closed")

EPROM (Erasable Programmable Read-Only-Memory): A form of Read-Only-Memory in which information is stored in an array of capacitors with very low leakage. Data stored in these capacitors will be retained for 10 years or more without reprogramming. These memories are often erasable by exposure to Ultraviolet light—also known as UV EPROM)

Mask ROM: A form of ROM where the information pattern is "masked" right onto the chip at the time of manufacture Flash ROM: A form of EPROM based upon conventional UV EPROM technology but which is provided with a mechanism for electrically pre-charging selected sections of the capacitive storage array, thereby effectively "erasing" all capacitive storage cells to a known state.

Dynamic RAM: DRAM or Dynamic Random Access Memory—a form of read/write memory wherein information is stored in a high-density, low-overhead array of capacitive storage cells. These cells are extremely small but have only relatively short-term storage capability and must be "refreshed" periodically. Hence, the "dynamic" name.

Static RAM: SRAM or Static Random Access Memory—a form of read-write memory in which data is stored in cells which retain their data values indefinitely as long as power is applied. Data is lost when power is removed.

Non-volatile RAM: Any form of read/write memory which retains data values even when power is removed. This form of memory is often implemented by providing long-term battery backup for conventional static RAM.

All of the memories types listed above are "random access" in that storage elements may be accessed in any arbitrary order. However, in common use, the term "Random Access Memory" implies that the memory can be both read and written. Electrically erasable ROM technologies tend to blur this distinction since they can be erased and re-written. In an attempt to emphasize the re-writable, non-volatile storage aspects of their Flash memory systems, some system designers have been known to refer to such memories as Flash RAM.

Conventional memories store information as a series of "bits" or binary digits which can take on one of two different values. These values are arbitrarily assigned the values 1 and 0, and are grouped together to represent larger numbers. For example, the binary number 110 (one,one,zero) represents the decimal number 6 (six).

Most static RAM memories are built around a latching cell which behaves much as a bi-stable latch or Flip-Flop. This latching cell can be caused to assume one of two active states, thereby providing the required two-valued storage capability.

Dynamic RAMs and EPROMS, however, are usually built around capacitive storage cells in which information is stored by controlling the amount of charge applied to capacitive storage elements within the cells. A "sense amplifier" is used to determine whether or not the charge on the storage element is above or below a preset threshold, thereby returning one of two possible results (i.e., a "one" or a "zero") for each capacitive storage element.

The maximum density of conventional memory is dictated by the size of the individual storage elements and the number of storage elements that can be integrated onto a single chip. Until recently, the only practical way to increase memory density has been to shrink the line width and transistor sizing (process geometry), a fairly incremental process heavily limited by photolithography and stepper tools developed by semiconductor equipment manufacturing companies.

A recent development in semiconductor memory is known as "multilevel technology" ("MLT"). The underlying premise of MLT memory is that a significant increase in memory density could be obtained if it were possible to store more information in each storage element of a conventional memory. Unfortunately, the storage elements (cells) of many conventional memory structures (e.g., Static RAM) are inherently restricted by their very nature to assuming only one of two possible (binary) states. Certain conventional memory structures do, however, lend themselves to greater storage density than can be achieved using conventional binary, two-level storage techniques. Some of the best candidates for this increased density are memory technologies such as DRAM and Flash ROM which use capacitive storage elements.

The information in capacitive-based storage elements is stored based upon the amount of charge on a capacitive storage cell. It seems reasonable then, that by quantizing information into units greater than binary units (e.g., 4-level or 8-level units), and providing the ability for charge to be stored in the capacitive storage cells in a greater (i.e, than two) number of discrete levels, that it would be possible to dramatically increase the storage capacity of such memories. In fact, companies such as Intel have already recently demonstrated the feasibility of such multilevel storage techniques.

However, there are some difficulties inherent with these techniques. It is, for example, more difficult to control the application of multiple discrete units of charge to a capacitive cell than it is simply to fully charge or fully discharge the cell. In attempting to store a value into a multilevel cell in a multilevel format, it must be ensured that the intermediate values (i.e., values between full-charge and full-discharge) are accurately and retrievably represented.

Even ignoring the problems of storing multilevel information, increasing the number of discrete values (units of charge) which can be stored in a capacitive storage cell can adversely affect cell readback in a variety of ways. For example, a greater number of discrete values reduces the "noise margin" of the cell as compared to two-level (binary) storage, making the storage element more prone to erroneous readout. Additionally, the storage-retention times specified for most capacitor-based ROM technologies are based upon the time it takes for natural capacitive "leakage" to degrade the stored charge to the point where the two-level readback threshold is no longer sufficiently reliable. In a multilevel storage cell, this retention time would be reduced due to correspondingly reduced charge-decay "margins" around multilevel thresholds. Because of the unreliable nature of current MLT memory, its use has tended to be limited to fault tolerant applications such as audio and video transmission wherein the human viewer or listener is tolerant of (insensitive to) a certain amount of "noise". Generally speaking, reliability is simple to quantify -namely, by determining whether values which have been stored are retrievable without corruption. For example, it would be of little use in the digital signal processing (DSP) arena to store (write) a value of THREE, and retrieve (read) a value of FOUR. These and other problems related to providing reliable multilevel storage dominate current research in the field of MLT memories.

The aforementioned capacitive storage element and multilevel charge storage is only one possible technique for implementing multilevel technology. In the more general case, multilevel memory technology can be built around any storage technique which permits more than two discrete values (states) to be stored in a single storage cell. A memory (storage) density benefit is ultimately realized only if the physical size of the multilevel storage cell is less than the aggregate size of the multiple conventional storage cells which would be required to store the same amount of information that could be reliably stored in a single MLT memory cell.

DISCUSSION OF THE PRIOR ART

The following documents, all of which are US patents, all of which are incorporated by reference herein, disclose various techniques having some relevance to the present invention.

U.S. Pat. No. 5,689,465 (November 1997) discloses semiconductor memory device and defective memory cell correction circuit. See also related U.S. Pat. No. 5,550,394 (August 1996). These patents describe methods for preventing errors in redundant memory address generation circuits. In contrast to the present invention, no mention is made of MLT memory.

U.S. Pat. No. 5,682,394 (October 1997) discloses fault tolerant memory systems and components employing dual level error correction and detection with disablement feature. See also related U.S. Pat. No. 5,533,036 (July 1996). These patents provide a useful background discussion of techniques for categorizing the nature of memory major failure mechanism modes.

U.S. Pat. No. 5,671,388 (September 1997) discloses method and apparatus for performing write operations in a multi-level cell storage device.

U.S. Pat. No. 5,668,756 (September 1997) discloses a multi-value level type non-volatile semiconductor memory unit and method of rewriting the same.

U.S. Pat. No. 5,612,912 (March 1997) discloses a method of multilevel DRAM sense and restore.

U.S. Pat. No. 5,602,789 (February 1997) discloses an electrically erasable and programmable non-volatile and multi-level memory system with write-verify controller.

U.S. Pat. No. 5,574,879 (November 1996) discloses addressing modes for a dynamic single bit per cell to multiple bit per cell memory.

U.S. Pat. No. 5,548,549 (August 1996) discloses method and device for improved programming threshold voltage distribution in electrically programmable and read only memory array.

U.S. Pat. No. 5.539,690 (July 1996) discloses write verify schemes for flash memory with multilevel cells.

U.S. Pat. No. 5,532.955 (July 1996) discloses a method of multilevel DRAM sense and restore.

U.S. Pat. No. 5,523,972 (June 1996) discloses method and apparatus for verifying the programming of multi-level flash EEPROM memory.

U.S. Pat. No. 5,515,317 (May 1996) discloses addressing modes for a dynamic single bit per cell to multiple bit per cell memory.

U.S. Pat No. 5,457,650 (October 1995) discloses apparatus and method for reading multi-level data stored in a semiconductor memory.

U.S. Pat. No. 5,450.363 (September 1995) discloses Gray-coding for a multilevel cell memory system.

U.S. Pat. No. 5,422,845 (June 1995) discloses method and device for improved programming threshold voltage distribution in electrically programmable read only memory array.

U.S. Pat. No. 5,377,148 (December 1994) discloses apparatus and method to test random access memories for a plurality of possible types of faults.

U.S. Pat No. 5,293,563 (March 1994) discloses multi-level memory cell with increased read-out margin.

U.S. Pat No. 5,012,448 (April 1991) discloses a sense amplifier for a ROM having a multilevel memory cell.

U.S. Pat No. 4,709,350 (November 1987) discloses a semiconductor memory using multiple level storage structure.

U.S. Pat. No. 4,771,404 (September 1988) discloses a memory device employing multilevel storage circuits.

U.S. Pat. No. 4,701,884 (October 1987) discloses semiconductor memory for serial data access. This patent is of interest as disclosing a traditional memory structure, including concepts of error correction codes (ECC) for improving reliability of memory (see, e.g., paragraph bridging columns 17–18). However, in contrast to the present invention, no reference to or suggestion of MLT memory is made in this Patent.

U.S. Pat. No. 4,661,929 (April 1987) discloses a semiconductor memory having multiple level storage structure.

In those of the above-referenced patents relating to MLT memory, a general focus is on improving noise margins. However, in contrast to the present invention, none of these references disclose or suggest detecting and correcting errors in the context of a block level MLT memory structure.

GLOSSARY

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used in the description contained herein:

A/D: Analog-to-Digital (converter).
ALU: Arithmetic Logic Unit.
ASIC: Application-Specific Integrated Circuit.
bit: binary digit.
byte: eight contiguous bits.
CAM: Content-Addressable Memory.
CAS: Column Address Strobe
CMOS: Complementary Metal-Oxide Semiconductor.
CODEC: Encoder/De-Coder. In hardware, a combination of A/D and D/A converters. In software, an algorithm pair.
CPU: Central Processing Unit.
D/A: Digital-to-Analog (converter).
DRAM: Dynamic Random Access Memory
DSP: Digital Signal Processing (or Processor)
ECC: Error Correction Code
EEPROM: Also E2PROM. An electrically-erasable EPROM.
EPROM: Erasable Programmable Read-Only Memory.
Flash: Also known as Flash ROM. A form of EPROM based upon conventional UV EPROM technology but which is provided with a mechanism for electrically precharging selected sections of the capacitive storage array, thereby effectively "erasing" all capacitive storage cells to a known state.
FPGA: Field-Programmable Gate Array
g: or (giga), 1,000,000,000
Gbyte: gigabyte(s).
GPIO: General Purpose Input/Output.
HDL: Hardware Description Language.
IC: Integrated Circuit.
I/O: Input/Output.
IEEE: Institute of Electrical and Electronics Engineers
JPEG: Joint Photographic Experts Group
k: (or kilo), 1000.
KHz: KiloHertz (1,000 cycles per second).
MAC: Media Access Control.
Mask ROM: A form of ROM where the information pattern is "masked" onto memory at the time of manufacture.
MCM: Multi-Chip Module.
memory: hardware that stores information (data).
M: (or mega), 1,000,000
MHz: MegaHertz (1,000,000 cycles per second).
MLT: Multi-Level (Multilevel) Technology.
NVRAM: Non-volatile RAM.
PLL: Phase Locked Loop
PROM: Programmable Read-Only Memory.
PWM: Pulse Width Modulation.
PLD: Programmable Logic Device.
RAM: Random-Access Memory.
RAS: Row Address Strobe.
RISC: Reduced Instruction Set Computer (or Chip).
ROM: Read-only Memory.
SIE: Serial Interface Engine.
software: Instructions for a computer or CPU.
SRAM: Static Random Access Memory.
UART: Universal Asynchronous Receiver/Transmitter.
USB: Universal Serial Bus.
UV EPROM: An EPROM. Data stored therein can be erased by exposure to Ultraviolet (UV) light.
VHDL: VHSIC (Very High Speed Integrated Circuit) HDL.

BRIEF DESCRIPTION (SUMMARY) OF THE INVENTION

It is therefore an object of the present invention is to provide a technique for increasing the reliability of MLT memories without completely negating the storage density improvements offered by MLT.

It is a further object of the present invention to provide reliable MLT memories whose external operational characteristics are substantially identical to those of conventional "binary" memory technologies.

According to the invention, error correction techniques are used in conjunction with MLT memories to improve the reliability of MLT memories and broaden the scope of potential MLT applications (i.e., beyond audio and video applications), for example into the digital signal processing (DSP) arena.

According to the invention, the overall memory architecture is treated as a noisy storage channel, and error correcting techniques are applied to the data written to and read from memory. Before writing to memory, each MLT word is encoded into a coded bit stream in such a way that the resultant coded data contains the original word plus additional redundant digits which are a function of the content of memory. During the read cycle, the stored data is decoded and, by applying redundancy techniques, errors may be corrected and eliminated during the read and write operations.

Various Error Correcting Codes (ECCS) are well known, and can broadly be categorized into two classes: "convolution" (or "convolutional") coding techniques and "block" coding techniques. Both techniques employ Forward Error Correction (FEC) which improves the bit error rate (BER) performance of power-limited and/or bandwidth-limited channels by adding structured redundancy to the transmitted data. The type of additive noise experienced on the channel determines the class of FEC used on the channel. Convolution (or "Tree") codes are typically used for channels with Additive White Gaussian Noise (AWGN) (random single bit errors), and block codes are typically used for channels with additive burst noise (random multi-bit errors) . Convolution coding techniques such as Viterbi encoding/decoding are known to be applied to serially-transmitted data in a communication channel which is subject to Gaussian noise such as a satellite channel. Viterbi decoding is a maximum-likelihood method which is fast enough to allow real-time decoding for short constraint length codes, when using high speed processors. Block coding techniques such as Hamming and Reed-Solomon have long been used to correct errors in data transmission systems by adding redundant data, and in some cases scrambling the original data.

Convolution codes, such as Trellis or Viterbi, are "progressive" codes, whose resultant output values depend upon the sequence or progression of input values direct through them. Such codes are widely employed in serial communications, the nature of which is to provide data in the form of an ordered, progressive stream. Convolution codes are generally directed to correcting errors which span over an ordered progression of data values or over a period of time. Such coding techniques may be applied most effectively to MLT memory applications wherein data is stored and read out in as a progression or sequence of ordered data values, such as in video and audio applications (and similar applications) wherein encoded video and audio information is provided in a continuous "data stream" which is both stored and read out in an ordered sequence.

Block codes are produced by coding techniques wherein generated code depends solely on instant input and has no history of prior input. Such codes are applied to "blocks" of data for which error detection and correction is self-contained and does not depend upon data in any other block. Accordingly, such codes are well suited to applications wherein blocks of data will be accessed in random order. Among the best known block codes for error correction is the family of REED SOLOMON such as are employed in the communication and disk storage industries.

According to an aspect of the invention, a pipeline architecture can advantageously be employed to minimize latency associated with coding (before a write operation) and decoding (before a read operation) if a block of data needs to be written or read back from MLT memory. Before WRITE, block data would be written to a temporary storage device (such as FIFO), processed and written to MLT RAMs. The depth of FIFO would directly depend on the length of shift registers used for coding of the data. After READ from MLT RAM data will be written to FIFO, and then the output of FIFO would be used for decoding of DATA. This overcomes the problem that coding (before WRITE operation), and decoding (before READ operation), would otherwise take several clock cycles depending on the length of shift registers used during decoding/encoding process.

An integrated circuit (IC) employing the techniques of the present invention may be included in a system or subsystem having electrical functionality. Example systems may include general purpose computers; telecommunications devices (i.e., phones, faxes, etc.); networks; consumer devices; audio and visual receiving, recording and display devices; vehicle; etc.. It is within the scope of the invention that such systems would benefit substantially from technique (s) of the present invention.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

DETAILED DESCRIPTION OF THE INVENTION

Figure 1:
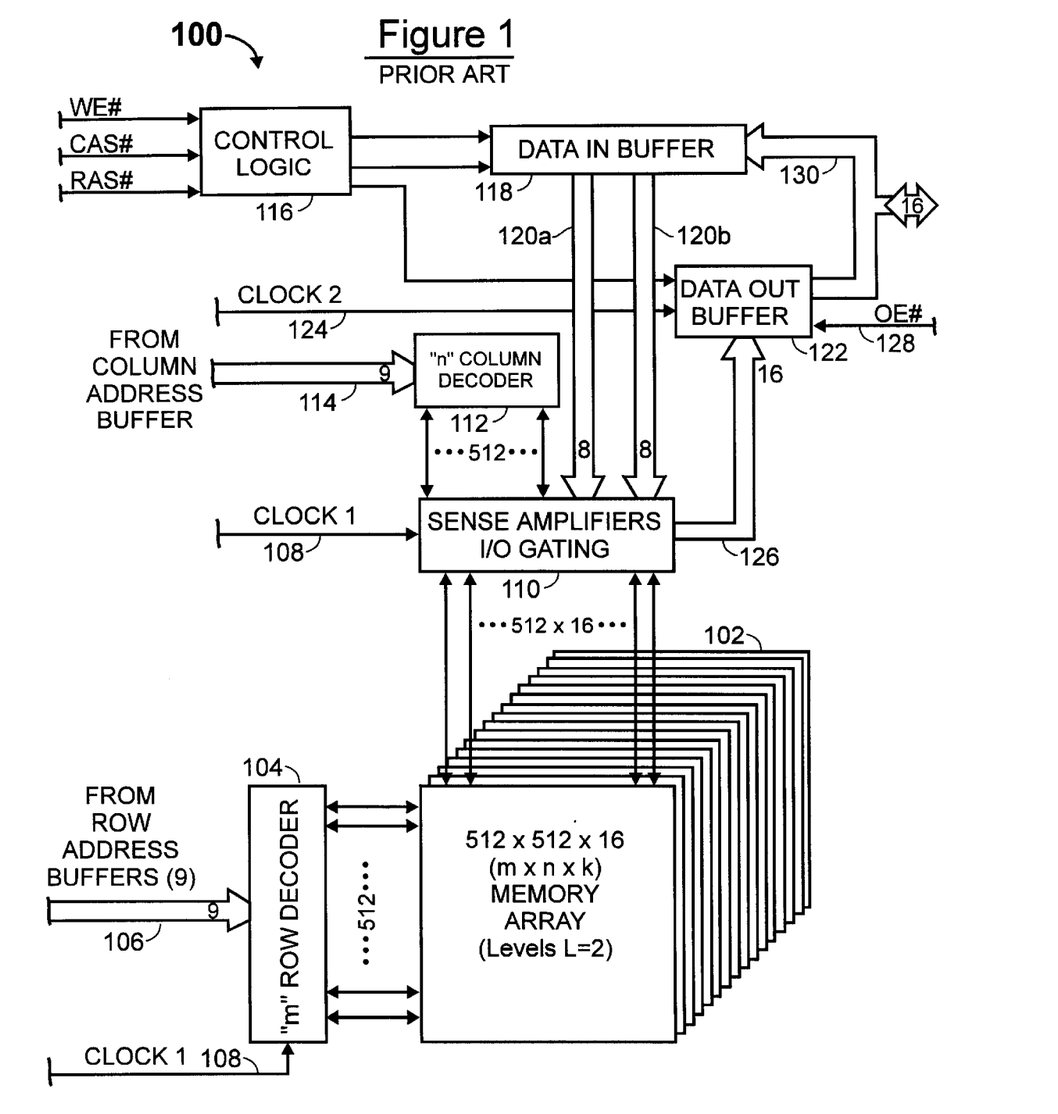
FIG. 1 is a block diagram of a conventional, binary RAM memory architecture, according to the prior art.

FIG. 1 shows a conventional binary memory architecture 100 wherein a memory array 102 is organized as an m-row by n-column array of binary storage cells. A "unit" of such memory may have, for example, m=512 addressable rows and n=512 addressable columns of memory cells. A number ("k") of such "m×n" units of memory cells may be provided. Each memory cell is capable of holding one of two possible binary states, representing a binary "1" or a binary "0".

Generally, binary data is written to and read from the memory array 102 in the following manner. A row decoder 104 receiving a row address on a bus 106 from address buffers (not shown) and under the control of a clock providing a clock signal (CLOCK 1) on a line 108. Sense amplifiers and I/O gating 110 synchronized to the row decoder 104 by the clock signal on the line 108. A column decoder 112 receiving a column address on a bus 114 from a column buffer (not shown). Control logic 116 receives control signals and data for write enable (WE#), column address strobe (CAS#) and row address strobe (RAS#) and provides the data to a data-in buffer 118 which writes data to the memory array 102 over buses 120a and 120b, via the I/O gating 110. The control logic also controls the operation of a data-out buffer 122 which is synchronized by a signal (CLOCK 2) on a line 124. Data is "read" by the sense amplifiers 110, and provided via a bus 126 to the data-out buffer 122 so that when requested by an output enable signal (OE#) on a line 128, the stored data is impressed upon the bus 130 for use by a microprocessor (not shown) or the like. This architecture is representative of a conventional binary memory architecture of any size. It bears mention, however, that assuming a 1-bit readback, a memory address is broken down into a row portion and a column portion. The row portion addresses one of the "n" rows, which selects "k" column values for that row (internally). A column decoder (112) is used to select one of the "k" column values. Each cell of the memory array (102) stores one of two distinct values. Both reading and writing of the selected cell are supported by RAMs of this type. ROMs require only read-back capability.

Figure 2:
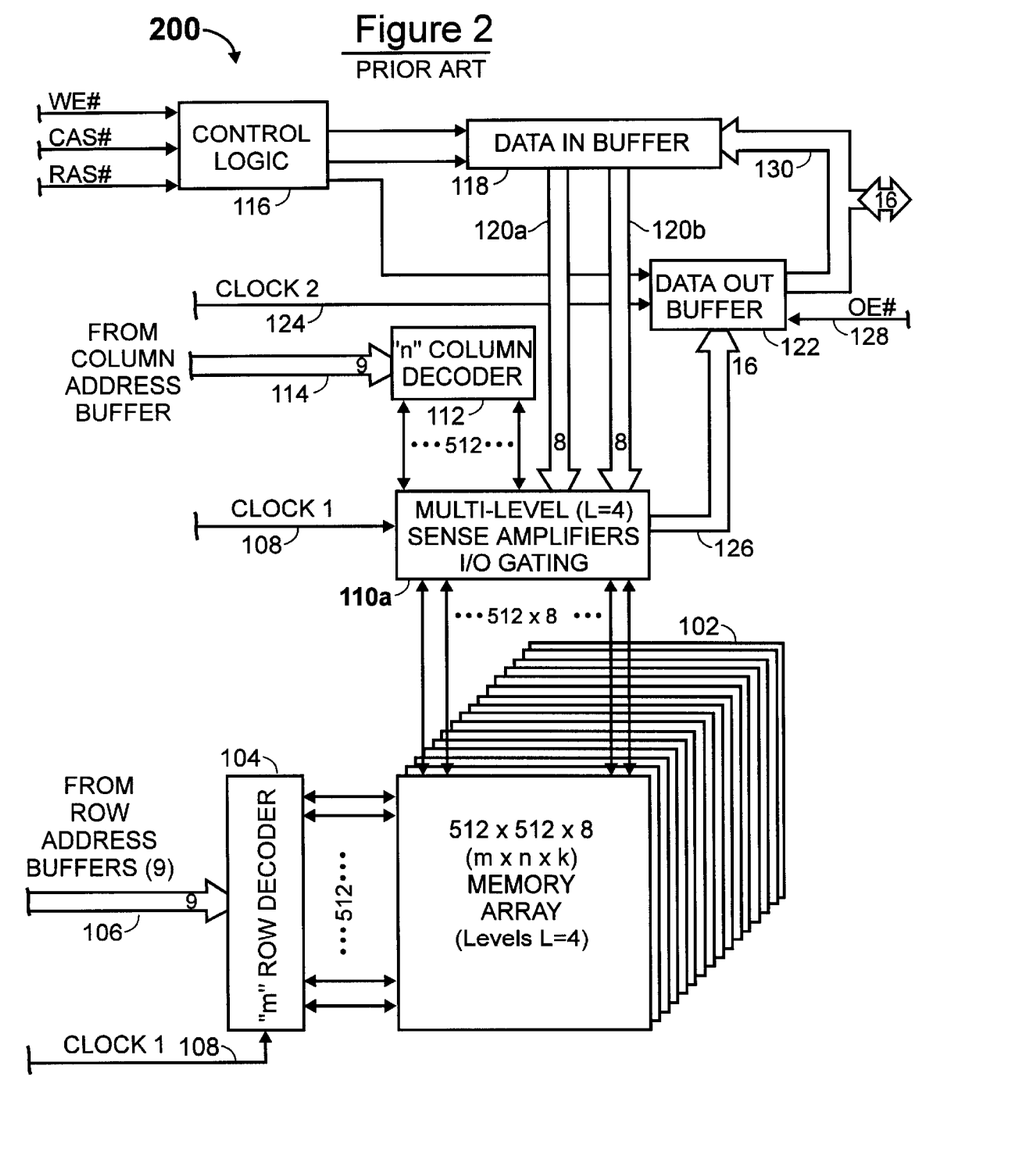
FIG. 2 is a block diagram of a conventional, binary MLT memory architecture, according to the prior art.

FIG. 2 shows a conventional multilevel (MLT) "variation" 200 of the above-described memory architecture 100 wherein each memory cell can assume one of four different multilevel (MLT) values (2 bits/cell). As is readily apparent from a comparison of FIGS. 1 and 2, most of the elements in this MLT storage architecture 200 can be identical to the elements of the previously-described binary-storage architecture 100. Notably, however, in this conventional MLT technique, the sense amplifier 110a (compare 110) is configured to convert two-bit binary information units to and from the four-level storage units of the MLT cells. Further, in FIG. 2, the size of the memory array 102 is reduced in proportion to the increase in the number of "levels". In this case, the number of levels is doubled and the number of memory cells is halved, i.e., the memory array 102 of FIG. 2 is organized as an array of 512×512×8 storage units as compared to the memory array 102 of FIG. 1 which is organized as an array of 512×512×16 storage units to store the same amount of information.

Figure 3:
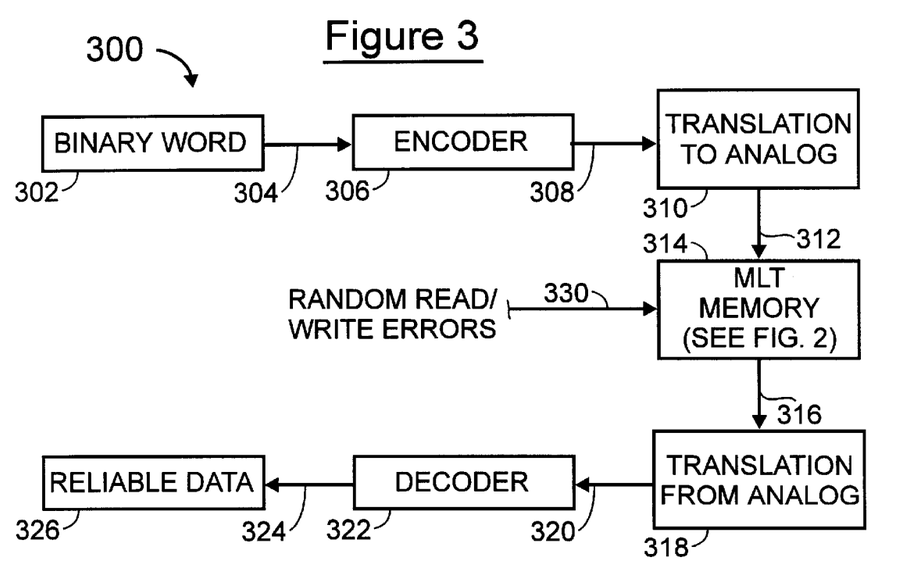
FIG. 3 is a high-level block diagram of a novel MLT memory architecture, according to the invention.

FIG. 3 shows the conversion from binary (2 level) to multilevel, according to the invention. A binary word is converted to a binary code by applying an error-correction scheme. The binary code is converted to the analog multilevel form required by the storage cells of the MLT memory. When reading the MLT memory, the multilevel storage is converted back to a binary digital code form, potentially incurring errors in the process, then decoded and error-corrected by a decoder to provide the originally stored binary word. The error correction scheme "wrapped around" the MLT memory corrects for random errors and provides reliable data storage and retrieval.

In FIG. 3, a reliable MLT memory system 300 is provided wherein an input binary word 302 is provided on a set of binary input lines 304 to an encoder unit 306. The encoder unit 306 adds error detection and correction information to the binary code word and provides an encoded input word onto a set of encoded input word lines 308 to a first translator unit 310. The first translator unit 310 encodes the encoded input word into a multi-level "analog" (i.e., non-binary) format on MLT input word lines 312 for storage into an MLT memory array 314.

Similarly, multi-level data retrieved from the MLT memory array 314 on MLT output word lines 316 is converted by a second translator unit 318 into an encoded output word on encoded output word lines 320 and provided to a decoder unit 322. As a result of inherently and other aforementioned problems associated with reliably retrieving data from MLT memories, the encoded output word on encoded output word lines 320 may have one or more errors associated with it. However, since it was encoded by encoder unit 306 with error-detecting and correcting information, the decoder unit 322 detects any such error corrects it, providing a reliable binary data output word 326 on binary output word lines 324.

By integrating an error correction scheme into an MLT memory, the reliability of the MLT memory is significantly enhanced, while simultaneously "hiding" the error correction scheme itself from the user of the memory. At the external interfaces to the memory (302, 304, 324, 326) the reliable MLT memory system 300 of FIG. 3 appears to the user as if it was like any "conventional" binary memory technology. The error correction scheme is completely transparent to the user, and serves to make the MLT memory less prone to errors.

For the purpose of applying "block" error correction codes or convolution codes to MLT memory, an internal wide-word format can be employed wherein data is stored in MLT memory in wide (e.g., 512 bit) error-corrected blocks. The external interface to the MLT memory might be less wide, e.g., 8, 16 or 32 bits. To retrieve an 8-bit unit from such an MLT memory, the wide-word in which the 8-bit unit is stored would be retrieved and error-corrected, then the desired 8-bit subset of the error-corrected wide-word would be provided at the external interface. This is not unlike techniques currently used in Dynamic RAM (DRAM) systems, wherein the memory storage array is very wide compared to the data units which are exchanged via the external interface to the memory.

Similarly, to store a small, 8-bit unit into an error-corrected MLT memory of this type, the wide-word into which the 8-bit unit is to be stored would be retrieved and error-corrected. Then the 8-bit unit would be stored into the wide-word which would then be re-encoded and stored into the MLT memory array. In this manner, large block codes can be applied to a memory which exchanges smaller units of data via its external interfaces.

Convolution codes can be applied to blocks of MLT data by "resetting" the encoding mechanism at the beginning of each block of data to be encoded/decoded. In this manner, the "history" required by the convolutional encoding/decoding mechanisms is initialized to a common starting point. As a result, the encoded/decoded blocks would be independent of one another.

It is within the scope of the invention that, in a manner similar to a DRAM refresh function, wherein conventional DRAM is periodically "refreshed" (i.e., read and re-written) to guard against data degradation as capacitive storage cells slowly discharge, the reliable MLT memory system of the present invention can periodically be "refreshed" to keep noise margins within the MLT memory array high and to improve reliability.

Figure 4:
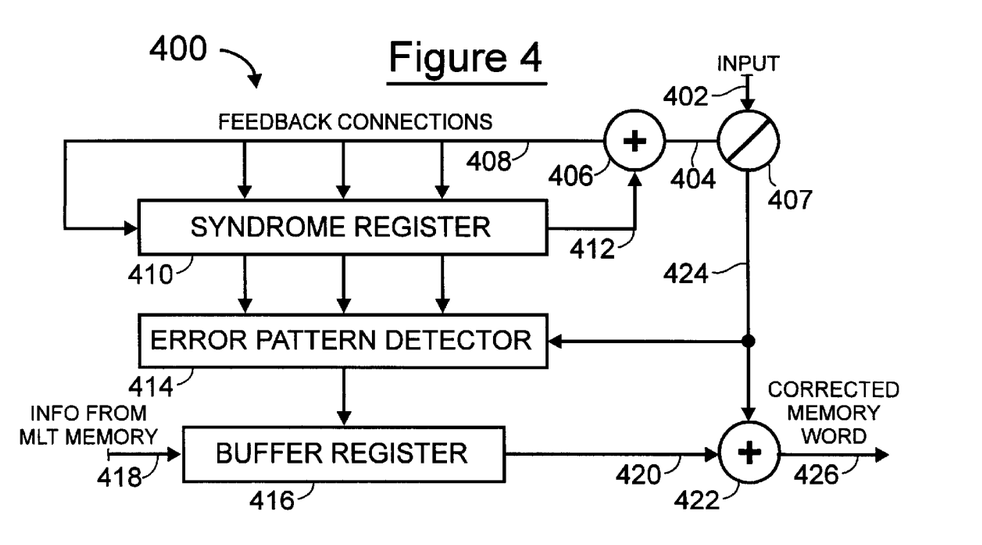
FIG. 4 is a block diagram illustrating the error-correction technique of the present invention.

FIG. 4 shows a generalized "syndrome-based" mechanism for decoding a binary code word with error-corrections. Examples of such error-correction techniques include Hamming code and Reed-Solomon code. "Hamming" code was designed by Richard Hamming, and is described in his book "Coding and Information Theory". Reed-Solomon and similar fault-tolerant encoding techniques are widely in use for correcting data from disk drives and other digital storage media. Reed-Solomon coding is the basis of error correction for the AIM (Association of Identification Manufacturers) standard for PDF-417 two-dimensional printed code and is described in the specification therefor.

In the generalized syndrome-based decoder of FIG. 4, input data 402 is directed via a splitter 407 along lines 404 to a combiner 406 which combines output from a syndrome register 440 on lines 412 with the input data on lines 404 to provide inputs 408 to the syndrome register. In this "re-circulatory" or "convolutional" fashion, a syndrome is developed from the input data. The syndrome is processed by an error pattern detector 414 which determines if an error exists in the input data and, if so, where. Input data from the MLT memory 418 is passed through a buffer register 416 and combined with results of the error pattern detection to provide an intermediate output on lines 420. This intermediate output is combined with input data 424 from the splitter 407 in a combiner 422 to produce a corrected result (memory word) 426.

The amount of additional MLT storage required for error-correction depends largely upon the anticipated error rate of the "raw" MLT memory and the desired "end-to-end" reliability as seen by the user of the error-corrected MLT memory. Generally speaking, however, error correction schemes add significantly less than 50% overhead—usually 10% to 25%. The amount of circuitry required to encode and decode most error correction coding schemes is minimal compared to the massive size of modern memory arrays, and does not impose a significant impact on overall memory density.

In summary, the present invention overcomes the inherent problems encountered when applying conventional sensing circuitry to an MLT memory architecture in the following manner. According to the invention, the overall memory architecture is treated as a noisy storage channel. Before writing to memory, each MLT word is encoded into a coded bit stream in such a way that the resultant coded data contains the original word plus additional redundant digits which are a function of the content of memory. During the read cycle, the stored data is decoded and, by applying redundancy techniques, errors may be corrected and eliminated during the read and write operations.

In certain applications such as audio and video, small data errors are readily tolerated. The mis-coloration of a few pixels in a large image is easily tolerated (and difficult to discern) by a user. In marked contrast thereto, in other applications such as general computing, networking and telecommunications, such small data errors can be fatal. By employing the error-detecting and correcting techniques of the present invention, existing MLT EEPROM and Flash devices may be improved to ameliorate the potential loss of accuracy in stored data, thus permitting MLT devices to be used in high-reliability areas, such as general computing, networking, telecommunications, etc.

SYSTEM INTEGRATION

It is clearly contemplated that the technique(s) of the present invention, as disclosed hereinabove, can be integrated with other electronic components and subsystems to realize a subsystem or a system having electrical functionality such as, but not limited to: general-purpose computers; telecommunication devices (e.g., phones, faxes, etc); networks; consumer devices; audio and visual (video) receiving, recording and display devices and systems; and vehicles such as planes, trains and automobiles.

Figure 5:
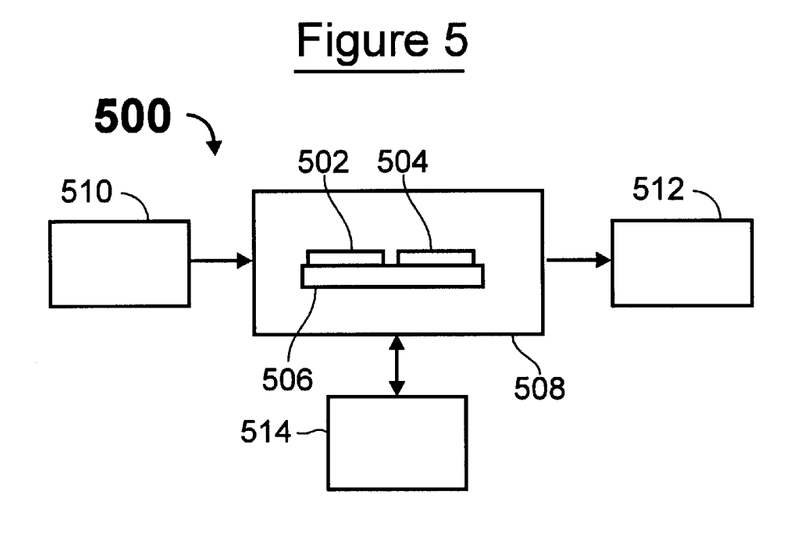
FIG. 5 is a schematic block diagram of a system incorporating the technique(s) of the present invention.

FIG. 5 illustrates an example of such an overall system 500. As shown therein, an electronic component 502 incorporating the technique(s) of the present invention can be connected, along with at least one other electronic component 504, on an interconnection substrate (e.g., motherboard) 506, thereby forming a subsystem 508, to which a number of peripheral (e.g., external) devices may be connected. Exemplary peripheral devices may include:

one or more devices 510 for providing inputs to the subsystem 508, such as keyboards, pointing devices, digitizing tablets, and the like;

one or more devices 512 for receiving outputs from the subsystem 508, such as video monitors, and the like; and one or more devices 514 for engaging in two-way communications with the subsystem 508, such as modems, printers, and the like.

It is clearly within the purview of a person having ordinary skill in the art to which the present invention most nearly pertains to effect such system integration, based on the descriptions set forth hereinabove.

Figure 5A:
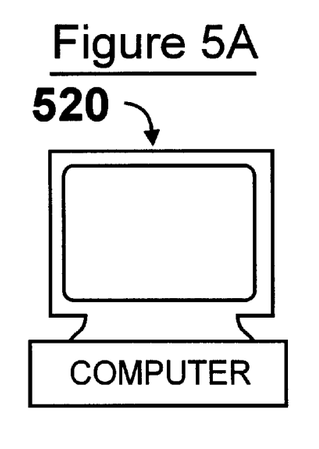
FIG. 5A is an illustration of a general purpose computer incorporating the technique(s) of the present invention.

FIG. 5A illustrates, for example, a general purpose computer 520 (compare 500) incorporating the present invention.

Figure 5B:
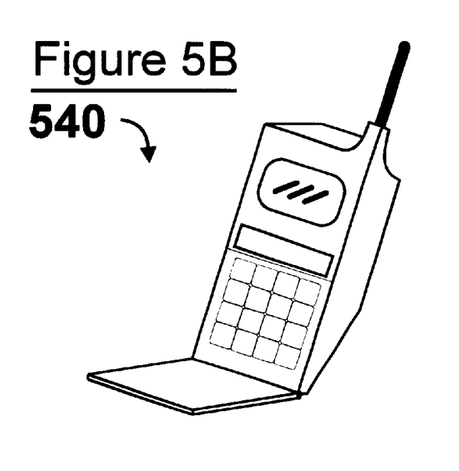
FIG. 5B is an illustration of a wireless telephone (cell phone) incorporating the technique(s) of the present invention.

FIG. 5B illustrates, for example, a wireless telephone 540 (compare 500) incorporating the present invention.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, the techniques disclosed hereinabove can be extended by using non-binary, multilevel units. In other words, for a given memory technology, storing MLT information only in power-of-two multilevel units of information (i.e., 4-level, 8-level, etc.) may not be optimal. It is contemplated that the techniques described hereinabove may be more reliable (and require less error correction) if the MLT information is stored in ternary (three-level) units or other non-binary (e.g., 5-level, 6-level, etc.) units. The basic MLT storage element, then, would become a base 3, base 5, or base 6 digit and storage of binary words into the MLT memory would involve a numeric base conversion. As with many base conversions, there may not be a perfect fit—i.e., there may be some excess MLT capacity which is not used by the binary information. For example, four ternary MLT cells could store 81 ($3^4$, or three raised to the fourth power) distinct values. The largest binary "word" which would fit into a four digit ternary cell would be a 6-bit binary word which could express only 64 different values. This excess storage capacity of the MLT memory could, for example, be dedicated to a multi-word error correction coding scheme.

By way of further example, an arithmetic coding scheme similar to one described by IBM for application to JPEG image encoding (see, e.g., the Joint Photographic Experts Group image encoding standard, version 6.0 for reference to this technique) could be adapted to efficiently encode binary information into a non-binary format.

What is claimed is:

1. Multilevel memory architecture, comprising:

an array of storage cells, each cell capable of holding a number greater than two distinct states;

means for encoding data into the number of states;

means for providing the encoded data to the storage cells as stored data;

means for accessing the stored data from the storage cells; and means for decoding the stored data.

2. Multilevel memory architecture, according to claim 1, further comprising:

a temporary storage device disposed between the means for encoding data and the array of storage cells.

3. Multilevel memory architecture, according to claim 2, wherein:

the temporary storage device is a FIFO.

4. Multilevel memory architecture, according to claim 1, further comprising:

a temporary storage device disposed between the means for accessing the stored data and the array of storage cells.

5. Multilevel memory architecture, according to claim 4, wherein:

the temporary storage device is a FIFO.

6. Multilevel memory architecture, according to claim 1, further comprising:

a first temporary storage device disposed between the means for encoding data and the array of storage cells; and a second temporary storage device disposed between the means for accessing the stored data and the array of storage cells.

7. Method of operating a multilevel memory, comprising:

before writing to memory, encoding each MLT word into a coded bit stream so that the resultant coded data contains the original word plus additional redundant digits which are a function of the content of memory; and writing the resultant coded data to memory as stored data.

8. Method, according to claim 7, further comprising:

during a read cycle, decoding the stored data.

9. Method, according to claim 8, further comprising:

during the read cycle, applying redundancy techniques to correcting and eliminating errors.

10. Method, according to claim 8, further comprising:

during the read cycle and before decoding the stored data, writing the stored data to a temporary storage device.

11. Method, according to claim 7, further comprising:

before writing to memory and before encoding, writing block data to a temporary storage device.

12. Method of operating a multilevel memory, comprising:

before writing to memory, encoding each MLT word into a coded bit stream so that the resultant coded data contains the original word plus additional redundant digits which are a function of the content of memory;

writing the resultant coded data to memory as stored data;

during a read cycle, decoding the stored data;

during the read cycle and before decoding the stored data, writing the stored data to a temporary storage device; and before writing to memory and before encoding, writing block data to a temporary storage device.

13. Method, according to claim 12, further comprising:

during the read cycle, applying redundancy techniques to correcting and eliminating errors.

14. An electronic system incorporating at least one integrated circuit (IC) chip, said IC chip comprising:

an array of storage cells, each cell capable of holding a number greater than two distinct states;

means for encoding data into the number of states;

means for providing the encoded data to the storage cells;

means for accessing the stored data; and means for decoding the stored data.

15. An electronic system, according to claim 14, wherein:

the electronic system is selected from the group consisting of general-purpose computer, telecommunication device, network device, consumer device, receiver, recorder, display device, and vehicle.

* * * * *